United States Patent
Gutfeldt et al.

(10) Patent No.: US 6,940,298 B2
(45) Date of Patent: Sep. 6, 2005

(54) HIGH FIDELITY ELECTRICAL PROBE

(75) Inventors: Theodore A. Gutfeldt, Berkeley, CA (US); Norman Chow, Milpitas, CA (US); Sarosh M. Patel, Sunnyvale, CA (US); Michael Caradonna, Santa Clara, CA (US)

(73) Assignee: Teradyne, Inc., Boston, MA (US)

( * ) Notice: Subject to any disclaimer, the term of this patent is extended or adjusted under 35 U.S.C. 154(b) by 116 days.

(21) Appl. No.: 10/262,370

(22) Filed: Sep. 30, 2002

(65) Prior Publication Data

US 2004/0063229 A1 Apr. 1, 2004

(51) Int. Cl.⁷ .............................................. G01R 31/02
(52) U.S. Cl. ....................................................... 324/758
(58) Field of Search .............................. 257/48; 439/38, 439/39, 40, 152, 482, 14, 17; 324/757, 758

(56) References Cited

U.S. PATENT DOCUMENTS

| | | | | |
|---|---|---|---|---|
| 3,628,137 A | * | 12/1971 | Mazur | ........................ 324/717 |
| 4,004,298 A | * | 1/1977 | Freed | ......................... 623/3.1 |
| 4,481,467 A | * | 11/1984 | Alexandersen et al. | .... 324/72.5 |
| 4,574,625 A | | 3/1986 | Olasz et al. | |
| 5,323,540 A | * | 6/1994 | McMurtry et al. | ............. 33/559 |
| 5,327,657 A | * | 7/1994 | Hajdukiewicz et al. | ........ 33/503 |
| 5,598,104 A | * | 1/1997 | Boyette, Jr. | .................. 324/754 |
| 5,678,944 A | * | 10/1997 | Slocum et al. | ................ 403/13 |
| 5,683,118 A | * | 11/1997 | Slocum | ....................... 285/119 |
| 5,982,182 A | * | 11/1999 | Chiu et al. | ................... 324/754 |

FOREIGN PATENT DOCUMENTS

GB  2313485 A  * 11/1997  ............ H01F/7/04

* cited by examiner

Primary Examiner—Olik Chaudhuri
Assistant Examiner—Lex H. Malsawma

(57) ABSTRACT

A probe assembly for use with a calibration/validation robot to calibrate/validate a plurality of semiconductor tester channels is disclosed. The probe assembly includes a bracket adapted for mounting to the robot and a probe element for engaging test points disposed on the semiconductor tester channels. A magnetic attach/release mechanism cooperates with the bracket and probe element to allow for the separation of the probe element from the bracket whenever the probe element meets a force that exceeds a predetermined value.

12 Claims, 3 Drawing Sheets

HIGH FIDELITY ELECTRICAL PROBE

FIELD OF THE INVENTION

The invention relates generally to automatic test equipment, and more particularly to an electrical probe for use with a robot to calibrate/validate a semiconductor tester.

BACKGROUND OF THE INVENTION

Automatic test equipment (ATE) plays an important role in the manufacture of semiconductor devices. The equipment typically applies test signals to one or more semiconductor devices under test (DUTs) and detects responsive output signals. By comparing the values of the detected signals to expected values, the acceptable functionality of the device can be confirmed.

With reference to FIG. 1, conventional ATE often includes a mainframe rack or computer workstation 10 that serves as a test controller for a separately disposed test head 12. The test head typically houses the pin electronics or "channel cards" that interface the ATE channel circuitry to the DUT pins (not shown) via a device-interface-board (DIB) 14. The tester channel resources usually follow a one-to-one correspondence with the DUT pins.

To maintain optimum accuracy, predictability and repeatability, the ATE channels are regularly calibrated and validated. This is commonly carried out by measuring signals along the ATE channel paths and determining whether the detected signals fall within predefined performance specifications. The measurement data is typically collected through use of an automated robot 16 that positions an electrical probe assembly 18 sequentially through a plurality of test points 20 disposed on the device-interface-board 14. The test points are located on the "channel" paths between each pin of the DUT and the tester.

Conventional calibration/validation robots often employ test probe assemblies that mount rigidly to the robot 16 through use of a fastener. While this is an inexpensive way to effect mounting of the probe, it is susceptible to damage if the probe inadvertently comes into contact with an unexpected surface. Repairing and replacing a rigidly mounted probe can result in an undesirable delay in validating the tester channels, causing an increase in overall test costs. Moreover, a rigidly mounted probe may loosen over several hundred touchdowns, possibly compromising the accuracy of the probe-to-test point registration and/or signal fidelity associated with the probe assembly.

What is needed and currently unavailable is a calibration/validation probe assembly mounting scheme for automatic test equipment that minimizes cost while maximizing calibration/validation accuracy. The high fidelity electrical probe assembly of the present invention satisfies these needs.

SUMMARY OF THE INVENTION

The high fidelity electrical probe assembly provides a low cost yet highly accurate way to collect ATE calibration and validation data from a device-interface-board.

In one aspect, the invention includes a probe assembly for use with a calibration/validation robot to calibrate/validate semiconductor tester channels. The probe assembly includes a bracket adapted for mounting to the robot and a probe element for engaging test points disposed on the semiconductor tester channels. A magnetic attach/release mechanism cooperates with the bracket and probe element to allow for the separation of the probe element from the bracket whenever the probe element meets a force that exceeds a predetermined value.

In another aspect, the invention includes a method of electrically probing a device-interface-board with a robot having an electrical probe assembly to acquire calibration/validation data from semiconductor tester channels. The method includes automatically positioning the electrical probe through a sequence of test points on the device-interface-board, and magnetically retaining the electrical probe in contact with the robot to, if the probe strikes an unintended surface, release from the robot.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Calibrating and validating the channels of a semiconductor tester is important to preserve the accuracy, predictability and repeatability of the ATE. Robotic systems that manipulate an electrical probe through a plurality of test point locations on a device-interface-board offer an automated way to proceed through the calibration/validation process.

Figure 1:
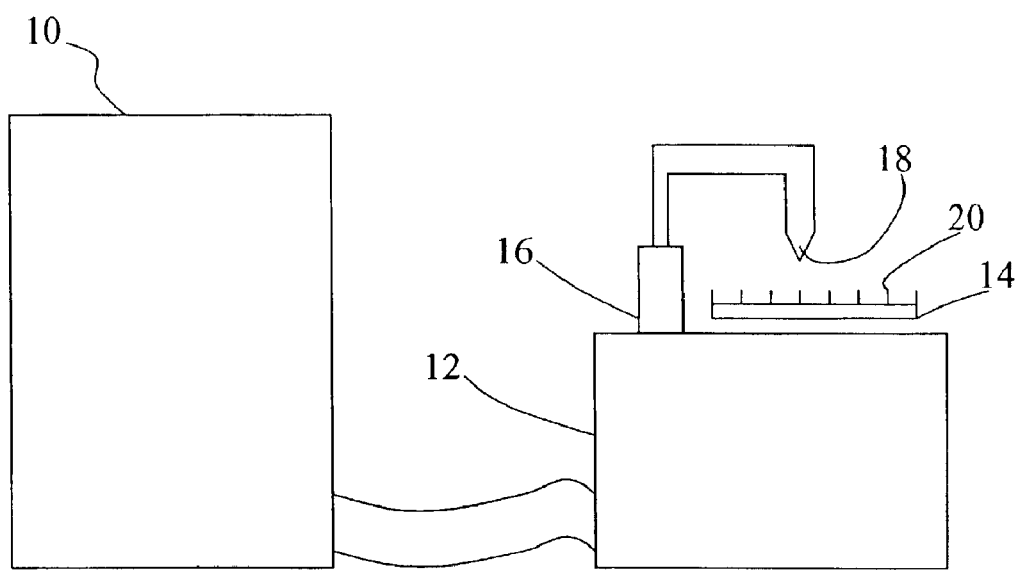
FIG. 1 is a high-level block diagram of a conventional semiconductor tester with a calibration/validation robot.
Figure 2:
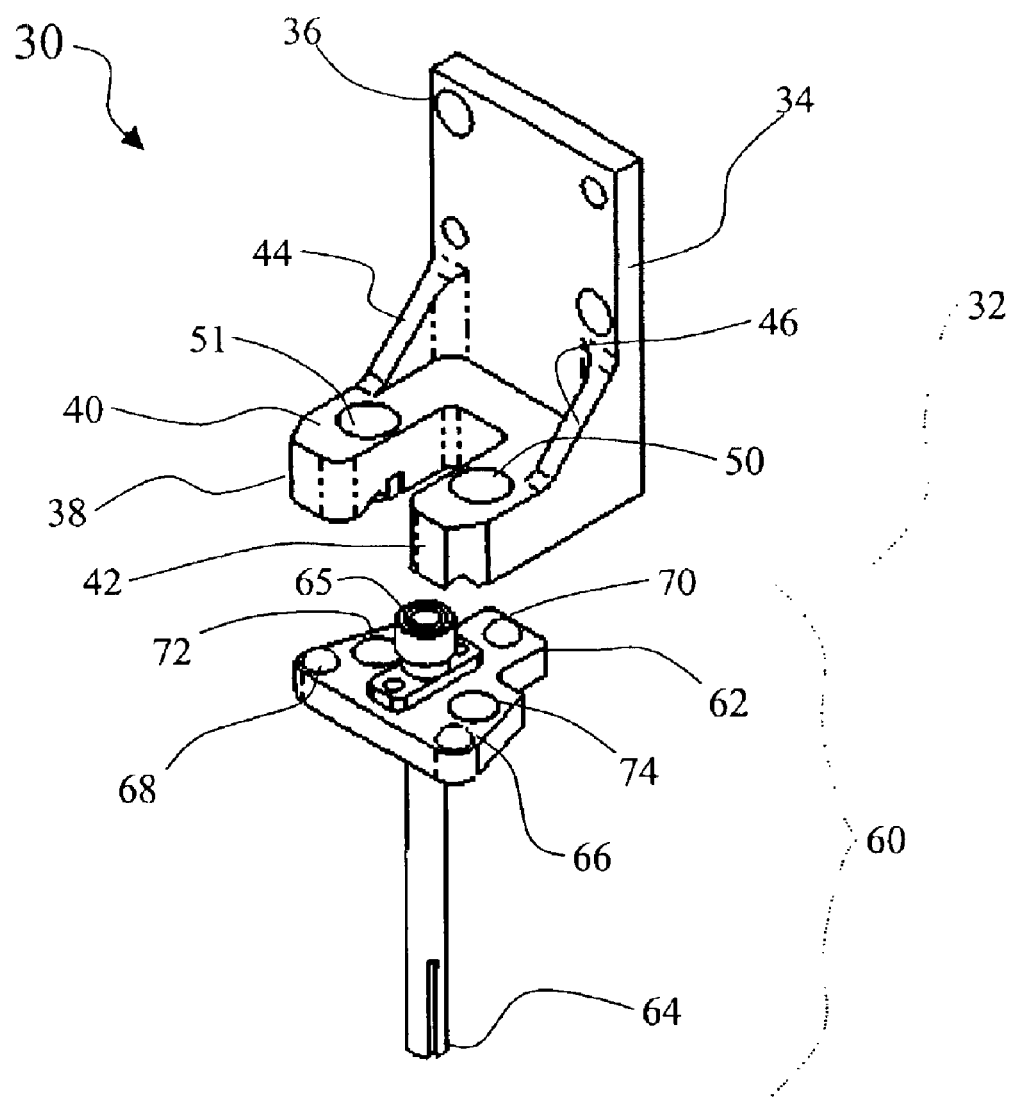
FIG. 2 is an exploded perspective view of an electrical probe assembly for use with an ATE calibration/validation robot.

Referring now to FIG. 2, the electrical probe assembly of the present invention, generally designated 30, includes an L-shaped bracket 32 adapted for mounting to a calibration/validation robot arm (not shown) and a probe element 60. A magnetic attach/release mechanism cooperates with the bracket and the probe element to allow for the separation of the probe element from the bracket whenever the probe element meets a force that exceeds a predetermined value.

Figure 3:
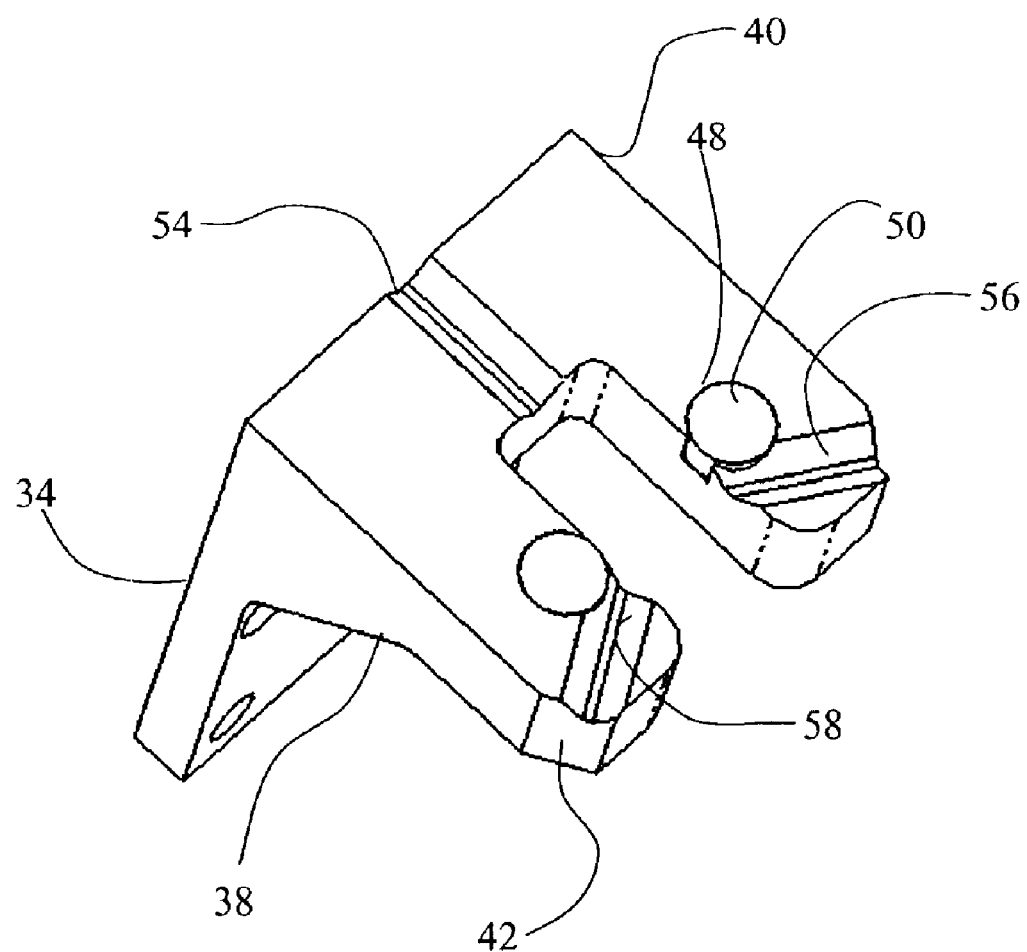
FIG. 3 is a perspective view along line 3—3 of FIG. 2.

With reference to FIGS. 2 and 3, the bracket 32 includes an upwardly projecting rectangular mounting flange formed 34 with a plurality of openings 36 for receiving fastening screws (not shown). A U-shaped base 38 having a pair of spaced-apart arms 40 and 42 projects orthogonally from one end of the flange 34 to define an L-shaped joint. A pair of lateral supports 44 and 46 are disposed on opposite sides of the flange/base joint.

Further referring to FIG. 3, the arms 40 and 42 each include a formed throughbore 48 sized to receive a cylindrical magnet 50. Formed into the backside 52 of the base 38 are three precision grooves 54, 56 and 58. Each groove includes a pair of oppositely disposed engagement surfaces that taper inwardly toward a common intersection point. The three grooves are disposed in a "wye" configuration to cooperate with the probe element 60 to effect a kinematic coupling as will be further described below.

Referring back to FIG. 2, the probe element 60 includes a thin plate 62 for mounting a coaxial probe tip 64. The distal end of the probe tip is formed to make a coaxial connection to a test point on the device-interface-board (not shown). The proximal end of the probe tip includes a miniature coaxial connector 65 adapted to receive a coaxial cable from the calibration/validation robot (not shown).

The plate 62 is further formed with three ceramic elements 66, 68 and 70 having spherical surfaces and disposed in a spaced-apart triangular configuration to precisely register with the three formed grooves 54, 56 and 58 of the bracket base 38. The cooperation of the three ceramic elements with the three grooves, when the probe element 60 is assembled to the bracket 32, forms a "kinematic coupling." The result is that the probe element can be disconnected and reconnected to the bracket any number of times without compromising the accuracy of the registration between the two assemblies. The ceramic elements also provide a unique isolation function between the bracket and the probe element that preserves the high fidelity nature of the coaxial probe.

Disposed on either side of the probe tip 64 are respective cylindrical steel inserts 72 and 74. The inserts are positioned such that when the probe element 60 is assembled to the bracket 32, the steel inserts lie proximate the magnets 50 and 51. This creates a preload on the assembly that requires a force of a predetermined threshold to separate the assemblies. The magnets and the steel inserts define the attach/release mechanism referred to above. The height of the spherical ceramic elements 66, 68 and 70, when coupled with the kinematic grooves 54, 56 and 58, defines the strength of the magnetic coupling between the magnets and the steel inserts. Preferably, a height is chosen so that the plate 62 can easily and safely detach from the bracket 32 if the probe element engages an unanticipated obstruction or surface.

Assembling the probe element 60 to the bracket 32 is a straightforward process. By merely aligning the kinematic coupling elements and placing the probe element proximate the bracket, the force of attraction between the magnets 50 and 51 and the steel inserts 72 and 74 brings the assembly together as a unit. A miniature coaxial cable (not shown) having one end assembled to a data collection device (not shown) assembles to the probe element coaxial connector 76 to effect a signal path from the probe tip to a data recording device (not shown).

In operation, the bracket is mounted to a robot arm (not shown) that positions the probe to electrically contact a plurality of test points while the tester is undergoing a calibration routine, according to a pre-programmed data acquisition process. For each test point, the robot positions the probe to effect a contact, applying and receiving calibration and/or validation signals to ensure that the channel fidelity meets performance specifications. During the positioning, should the probe accidentally engage an unexpected surface or object, the magnetic mechanism allows the probe tip to break free with no resulting damage. Under these circumstances, the test operator merely places the probe tip back in close proximity to the bracket, where it conveniently falls into its proper position with respect to the bracket due to the kinematic coupler.

Those skilled in the art will appreciate the many benefits and advantages afforded by the present invention. Of significant importance is the use of a magnetic attach/release mechanism for joining the probe element to the bracket. In so doing, repair and replacement of the probe may be performed quickly and efficiently. Moreover, by employing a kinematic coupling between the probe element and the bracket, adjustments to the probe element for registration to the DIB test points are minimized, reducing test costs.

While the invention has been particularly shown and described with reference to the preferred embodiments thereof, it will be understood by those skilled in the art that various changes in form and detail may be made therein without departing from the spirit and scope of the invention.

What is claimed is:

1. A probe assembly for use with a calibration/validation robot to calibrate/validate a plurality of semiconductor tester channels, the probe assembly comprising:
   a bracket configured to mount to a calibration/validation robot, the bracket including at least one groove;
   a probe element to engage electrically test points disposed on semiconductor tester channels, the probe element comprises at least one spherical ceramic to engage the at least one groove to form a kinematic coupling between the bracket and the probe element to effect repeatable registration to test points disposed on the tester channels and to effect electrical isolation between the bracket and the probe element; and
   a magnetic attach/release mechanism cooperating with the bracket and probe element to allow for the separation of the probe element from the bracket whenever the probe element comes under a force that exceeds a predetermined value.

2. The probe assembly of claim 1 wherein the magnetic attach/release mechanism comprises at least one magnet that forms a magnetic coupling force with a spaced-apart ferromagnetic element.

3. The probe assembly of claim 2 wherein:
   the at least one magnet is disposed on the bracket; and
   the ferromagnetic element is disposed on the probe element.

4. The probe assembly of claim 1 wherein the bracket is formed with a U-shaped base and an upwardly projecting rectangular mounting flange, the base having one end mounted to the flange to define an L-shape.

5. The probe assembly of claim 4 wherein the at least one groove is a first groove, a second groove and a third groove and the U-shaped base includes a bottom side having the first groove, the second groove and the third groove defining a "wye" configuration.

6. The probe assembly of claim 5 wherein the at least one spherical ceramic is a first spherical ceramic, a second spherical ceramic and a third spherical ceramic and the probe element includes a flat plate comprising the first spherical ceramic, the second spherical ceramic and the third spherical ceramic, each spherical ceramic engaging a corresponding groove.

7. A probe assembly for use with a calibration/validation robot to calibrate/validate a plurality of semiconductor tester channels, the probe assembly comprising:
   a bracket configured to mount to a calibration/validation robot, the bracket including at least one spherical ceramic;
   a probe element to engage test points disposed on semiconductor tester channels, the probe element comprises at least one groove to engage the at least one spherical ceramic to form a kinematic coupling between the bracket and the probe element to effect repeatable registration to test points disposed on the tester channels and to effect isolation between the bracket and the probe element; and
   a magnetic attach/release mechanism cooperating with the bracket and probe element to allow for the separation of the probe element from the bracket whenever the probe element comes under a force that exceeds a predetermined value.

8. The probe assembly of claim 7 wherein the magnetic attach/release mechanism comprises at least one magnet that forms a magnetic coupling force with a spaced-apart ferromagnetic element.

9. The probe assembly of claim 8 wherein:

the at least one magnet is disposed on the bracket; and the ferromagnetic element is disposed on the probe element.

10. The probe assembly of claim 7 wherein the bracket is formed with a U-shaped base and an upwardly projecting rectangular mounting flange, the base having one end mounted to the flange to define an L-shape.

11. The probe assembly of claim 10 wherein the at least one spherical ceramic is a first spherical ceramic, a second spherical ceramic and a third spherical ceramic and the U-shaped base includes a bottom side comprising the first spherical ceramic, the second spherical ceramic and the third spherical ceramic.

12. The probe assembly of claim 11 wherein the at least one groove is a first groove, a second groove and a third groove and the probe element includes a flat plate comprising the first groove, the second groove and the third groove defining a "wye" configuration, each spherical ceramic engaging a corresponding groove.

* * * * *